US007750314B2

(12) United States Patent
DiVergilio

(10) Patent No.: US 7,750,314 B2
(45) Date of Patent: Jul. 6, 2010

(54) ELEVATED TEMPERATURE RF ION SOURCE

(75) Inventor: William F. DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 177 days.

(21) Appl. No.: 12/183,787

(22) Filed: Jul. 31, 2008

(65) Prior Publication Data

US 2009/0032727 A1 Feb. 5, 2009

Related U.S. Application Data

(60) Provisional application No. 60/952,895, filed on Jul. 31, 2007.

(51) Int. Cl.
*H01J 27/00* (2006.01)
*H01T 23/00* (2006.01)
(52) U.S. Cl. ............... 250/423 F; 250/423; 250/423 R; 250/424; 250/427; 315/111.81; 315/111.91
(58) Field of Classification Search ................. 250/423, 250/423 F, 423 R, 424, 427; 315/111.81, 315/111.91
See application file for complete search history.

(56) References Cited

U.S. PATENT DOCUMENTS

| 7,176,469 B2* | 2/2007 | Leung et al. ............. 250/423 R |
| 2009/0032728 A1* | 2/2009 | DiVergilio et al. .......... 250/424 |
| 2009/0114841 A1* | 5/2009 | DiVergilio .................. 250/427 |

* cited by examiner

*Primary Examiner*—Robert Kim
*Assistant Examiner*—Meenakshi S Sahu
(74) *Attorney, Agent, or Firm*—Eschweiler & Associates, LLC

(57) ABSTRACT

An elevated temperature RF ion source system, comprising an ion source body, an RF antenna coil external to the ion source body, a vacuum enclosure surrounding both the outside surface of the ion source body and the RF antenna coil, at least one power supply, a gas delivery system operatively coupled to the ion source body, a vacuum condition between the outside surface of the ion source body and the RF antenna coil, the RF antenna coil operatively coupled to the at least one power supply, and a water cooling system operatively coupled to the RF antenna coil and the vacuum enclosure.

22 Claims, 3 Drawing Sheets

ELEVATED TEMPERATURE RF ION SOURCE

REFERENCE TO RELATED APPLICATION

This application claims priority to and the benefit of U.S. Provisional Application Ser. No. 60/952,895 which was filed Jul. 31, 2007, entitled ELEVATED TEMPERATURE RF ION SOURCE, the entirety of which is hereby incorporated by reference as if fully set forth herein.

FIELD OF THE INVENTION

The present invention relates generally to radio frequency (RF) ion source semiconductor processing systems and more specifically to a system and method for ion implantation of substrates by employing an elevated temperature RF ion source.

BACKGROUND OF THE INVENTION

The semiconductor industry employs ion implantation in the manufacture and processing of very large scale integrated circuits. Ion implantation is a process by which dopants are added to a workpiece, such as a semiconductor wafer by impacting accelerated charged atoms or molecules (positive or negative ions) against semiconductor substrates. One of the objectives of ion implantation is to introduce a desired atomic species into the target material, the semiconductor wafer or workpiece.

Hot cathode DC arc ion sources have been the standard in semiconductor ion implantation. These sources have an internal cathode that is negatively biased with respect to the ion source body walls. Electrons are accelerated away from the cathode toward the walls of the ion source, ionizing gas molecules and thereby creating a plasma. The body of the ion source is typically supported inside of a vacuum system and therefore the source body is thermally isolated from the outside. Gases within the source body build up on the walls of the ion source if the source and/or source walls are not sufficiently hot. For example, if arsine (an arsenic hydrogen compound) is used, arsenic (As), that did not ionize, can plate out on the source walls as a contaminant. If the ion source body does not reach a high enough temperature, the Arsenic will remain on the walls and can contaminate future implantation when the system is changed over to a new gas, for example, phosphine ($PH_3$). However, ion sources for semiconductor ion implantation are generally operated at temperatures of 300-600 degrees Celsius (572-1112 degrees Fahrenheit) in order to avoid deposition on the ion source surfaces.

Standard RF source design requires that the ion source wall temperature be in the range of approximately 20-100 degrees Celsius (68-212 degrees Fahrenheit). This incompatibility in temperature requirements has prevented the widespread use of RF sources in the semiconductor ion implant industry.

In addition, current arc discharge DC ion sources can only run a few hundred hours or less before having to perform maintenance on the ion source. The cathode is worn out by the constant bombardment of ions and therefore has to be replaced.

In view of the above problems associated with current arc discharge DC ion sources and RF ion beam sources with regard to semiconductor manufacture and processing, it would therefore be desirable to have a system and method which mitigates such issues. Thus, there exists a need for an improved system and method for ion sources used in semiconductor implantation.

SUMMARY OF THE INVENTION

The present invention overcomes the limitations of the prior art mentioned supra. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

By way of illustration, and not limitation, the present invention is directed generally toward an elevated temperature RF ion source system, comprising an ion source body, an RF antenna coil external to the ion source body, a vacuum enclosure surrounding both the outside surface of the ion source body and the RF antenna coil. The system further comprises at least one power supply, a gas delivery system operatively coupled to the ion source body, and a vacuum condition between the outside surface of the ion source body and the RF antenna coil. The RF antenna coil operatively coupled to the at least one power supply, and a water cooling system operatively coupled to the RF antenna coil and the vacuum enclosure.

According to another exemplary aspect of the present invention, an elevated temperature RF ion source system comprises an ion source body, an RF antenna partially internal to the ion source body, at least one insulation tube surrounding the RF antenna, and at least one power supply. The system further comprises at least one antenna support, a heater, a source flange, a cooling component, and a gas delivery component operatively coupled to the ion source body, the ion source body operably coupled to a vacuum component, the at least one antenna support centers the RF antenna within the at least one insulation tube. The at least one tube is internal to the ion source body, the RF antenna coil and the source flange are operatively coupled to the at least one power supply, and a cooling component is operatively coupled to the RF antenna coil and the vacuum enclosure.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
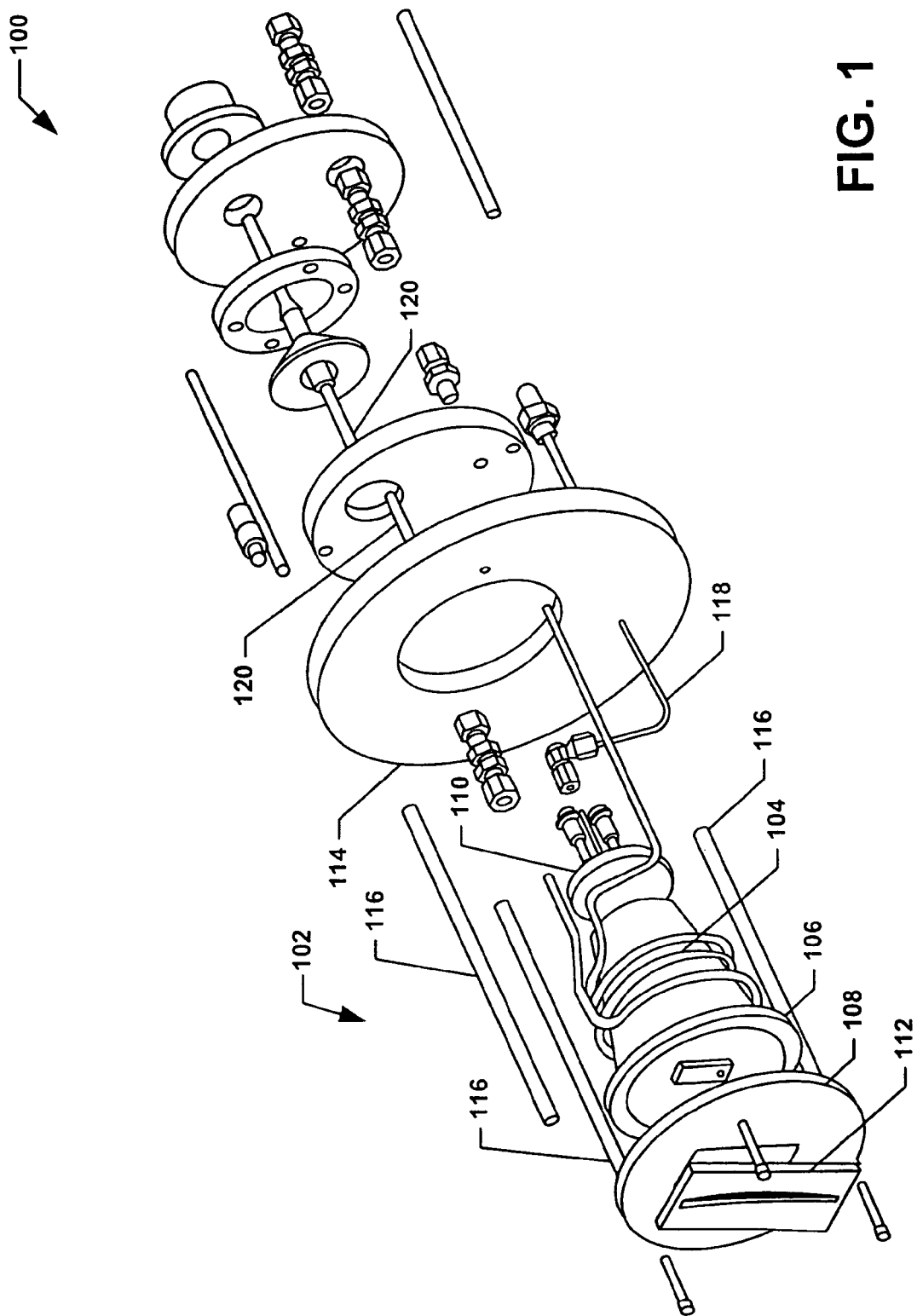
FIG. 1 is an exploded perspective view of an exemplary elevated temperature RF ion source system according to one aspect of the present invention.

The present invention is directed generally towards a system and method for employing a high temperature RF ion source when manufacturing or processing semiconductors using an ion implantation system, for example. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
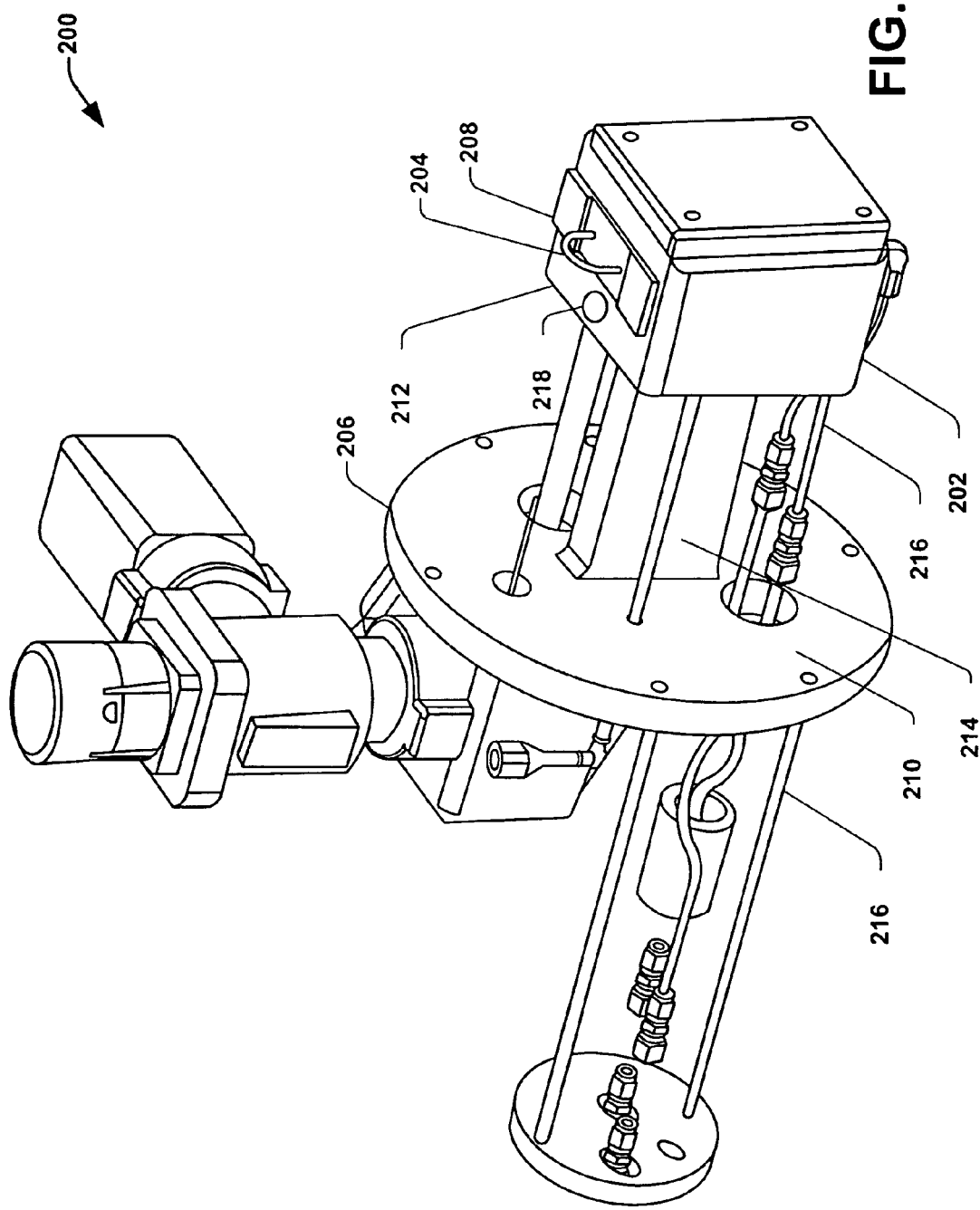
FIG. 2 is a perspective view of an exemplary elevated temperature RF ion source system according to another exemplary aspect of the invention.

Referring now to the figures, FIG. 1 and FIG. 2 illustrate two different embodiments of ion source. FIG. 1 illustrates an exploded perspective view of an elevated temperature RF ion source 100 where an RF antenna excitation coil 104 is external to a plasma chamber. Whereas, FIG. 2 illustrates a perspective view of an elevated temperature RF ion source system 200, wherein an RF antenna 204 is within a source body 202 surrounded by synthetic sapphire tubes ($Al_2O_3$) 302 that isolate and protect the antenna 204 from the plasma within the source body 202. In accordance with one exemplary aspect of the present invention, FIG. 1 illustrates the exemplary elevated temperature RF ion source system 100, wherein the system is operable to provide plasma within an ion source body 102. As stated above, various aspects of the present invention may be implemented in association with any type of ion implantation apparatus, including, but not limited, to the exemplary system 100 of FIG. 1. The elevated temperature RF ion source system 100 comprises the ion source body 102 that includes an alumina cone 106, a molybdenum (Mo) front flange 108 and a molybdenum (Mo) back flange 110 and an extraction aperture 112 that forms a discharge chamber in which ion plasma (not shown) is initially formed before being directed to a workpiece location. In other words, the ion source body 102 can be defined as those components that are in contact with the ion plasma. It should be appreciated that the alumina cone 106 can be various shapes, for example, a cylinder, a half sphere, etc., and can be made of various materials, e.g., quartz, boron nitride or other refractory dielectrics. The RF antenna excitation coil 104, surrounds the alumina cone 106 of the ion source body 102 and can be powered by a power supply (not shown) to create the plasma within the ion source body 102. The extraction aperture 112 allows the ions to exit a discharge chamber and thereby direct an ion beam toward a workpiece.

The ion source body assembly illustrated in FIG. 1, for example, can provide a water cooled source flange 114, which regulates the temperature of the ion source body 102. It should be noted, however, that other type cooling approaches may alternatively be employed, and fall within the scope of the present invention.

According to one exemplary aspect of the present invention, the water cooled source flange 114 can be connected to the molybdenum front flange 108, by employing support rods 116. Gas lines 118 can supply gas to the ion source body 102 in order to form the plasma and water lines 120 are employed to cool various surfaces and the RF antenna excitation coil 104. Without utilizing cooling, it is possible that the antenna 104 can fail (e.g., melt) and/or the RF losses can exceed an acceptable limit, becoming inefficient.

An alternating current in the RF antenna excitation coil 104 creates an electromagnetic field within the ion source body 102 that generates a circulating current in the gas. The electromagnetic field breaks down the gas and the temperature of the ion source body 102 increases as plasma impinges on the inner walls, transferring energy thereto. The water cooled source flange 114 and the water cooled antenna excitation coil 104 remain close to room temperature (approximately 50 C) in one embodiment. There is very little thermal conduction through the supports rods 116 to the source flange 114 and, as discussed supra, the antenna 104 is separated from the aluminum cone 106 in vacuum, for example, by a 4 mm gap. Therefore, the ion source body 102 loses the majority of its heat through radiation heat loss, which allows the temperature to remain at an elevated level which can prevent gases from condensing on the internal walls of the ion source body 102. Therefore the gases thereby do not become contaminants when changes are made to the source gas. In addition, unlike a cathode system, the RF antenna excitation coil 104 is external to the plasma creation area of the ion source body 102 and therefore the antenna is not damaged during plasma generation/collision. Therefore the system has far greater time between maintenance operations (1000's of hours versus 100's of hours or less).

According to still another exemplary aspect of the present invention, FIG. 2 is a perspective view of the elevated temperature RF ion source system 200. The aluminum ion source body 202 employed in the system 200 is illustrated to aid in the understanding of generation of plasma, utilizing a radio frequency (RF) field. The RF antenna 204 can be made of, for example, a 3.18 millimeter (⅛ inch) outside diameter, a 0.813 mm (0.032 in.) wall thickness and copper tubing mounted within the aperture region (not shown) of the source body 202. The source body 202 is conductively coupled to a water cooled source vacuum flange 206. The RF antenna 204 can be precisely located inside the ion source body 202, by utilizing antenna support plates 208 mounted on the top and bottom of the ion source body 202. The antenna support plates 208, for example, can be machinable ceramic, aluminum with ceramic inserts, alumina, quartz, etc. The copper tubing can be located, for example, in the center of a 10 mm (outside diameter) synthetic sapphire ($Al_2O_3$) tube (not shown) having a wall thickness of 1 mm (0.039 inch), for example. The Sapphire tube 320 can be precisely located using, for example, feed through supports machined in the ion source body 202, precision inserts in the ion source body 202, etc.

The synthetic sapphire tubes ($Al_2O_3$) 302 have high strength, hardness and chemical stability and are an excellent material at high temperature and severe environments, for example, fluorine attack. The ends of the tubes can be ground in order to ensure roundness and proper fit in the ion source body 202 locating holes. It is possible to have the ion source body 202, a support flange 210, a heater block 212 (shown as part of the source body 202) and the water cooled source vacuum flange 206 machined out of a single billet of, for example, aluminum in order to eliminate less conductive surface to surface thermal interfaces.

In one exemplary embodiment of the present invention, the elevated temperature RF ion source system 200 can be employed to generate plasma for substrate ion implantation, as an ion source for other applications, and the like. The source vacuum flange 206 can be water cooled and maintained at a relatively constant temperature $T_0$. The variation in $T_0$, as the discharge power is varied can be assumed, for example, to be small compared to the difference between $T_0$ and the source temperature ($T_S$), The maximum power ($P_{HMAX}$) for a heater installed in a cavity 218 in the heater block 212 can be chosen to be equal to the maximum design discharge power ($P_{DMAX}$):

$$(P_{MAX}) = (PDMAX) = (PHMAX)$$

The source assembly in one embodiment is isothermal with a maximum design temperature of ($T_{SMAX}$). Support rods 214 can have a uniform length (L) and a cross sectional area (A) and the associated radiation losses in the rods 214 can be neglected in the first order and treated as a second order correction, for example.

In order for the system to obtain maximum source power, the maximum power will equal the discharge power plus the heater power, $(P_{MAX})=(P_D)+(P_H)$, the source temperature can be maintained at a maximum value of $T_{SMAX}$ and the heat conduction equation becomes:

$$P_{MAX} = K\frac{A}{L}(T_{SMAX} - T_0)$$

Where K is the thermal conductivity of aluminum (K=250 W/mK). Solving for the total support rod area:

$$A = \frac{P_{MAX}(L)}{K(T_{SMAX} - T_0)}$$

For example, for a length, L=0.18 meters (0.59 feet) and the following chosen values below:

$P_{MAX}$=500 W $T_0$=50° C.

$T_{SMAX}$=300° C.

The rod area is calculated as follows:

$$A = \frac{500 \text{ W}(0.18\,m)}{250\frac{\text{W}}{mK}(300°\text{C.}-50°\text{C.})}$$

$$= 1.44 \times 10^{-3} m^2$$

$$= 14.4\,cm^2\,(0.0155\,ft^2)$$

This is a reasonable cross sectional area for the source support rods, one bar 214 as illustrated in FIG. 2, or, for example, four, square, cross sectional bars, each 1.9 cm (0.748 inches) on a side. For multipurpose operation, with industry standard gases such as Arsine and Phosphine, the source $(T_S)$ can be maintained, for example, at a constant 300° C. As the discharge power is varied, by varying the heater power $(P_H)$ the system can maintain a constant total power $(P_{MAX})$ of 500 watts. A temperature measuring device (e.g., thermocouple, thermistor, resistance temperature detector (RTD), etc.), may be strategically mounted to the ion source body 202 block to monitor the temperature. A control system may then fine tune the heater power very accurately. For other fill gases a different source temperature may be desired, for example, in $B_{18}H_{22}$ operation, a source temperature of $T_S$ equal to approximately 150° C. is required to prevent $B_{18}H_{22}$ condensation. For example, the source (discharge) power for $B_{18}H_{22}$ can be less than approximately half of the full power estimate, and with $T_0$ of approximately 35° C., solving for the total power required:

$$P = \frac{KA}{L}(T_s - T_0)$$

-continued $$P = 250\frac{\text{W}}{mK}\frac{1.44 \times 10^{-3}}{0.18\,\text{m}}m^2(150°\text{C.}-35°\text{C.})$$

$$P_{Total} = 230\text{ W}$$

The RF discharge power can be, for example, less than 100 W, so that the heater will have to supply around 130 W to provide a total power of 230 W.

In yet another example, performing a second order thermal analysis on the radiation from the ion source body 102:

$$P = \in \sigma A T^4$$

$$\sigma = 5.67 \times 10^{-8}\frac{\text{W}}{m^2 K^4}$$

$\in = 0.06$ (polished aluminum)

$T = 573\,K$ $A = 25 \times 10^{-3} m^2$ $P = 9\,W$

This can be taken as negligible, for example, as assumed in the first order calculation.

In yet another example, the conduction path area of the gas feed line 214 (FIG. 2) can be calculated for a ¼ inch outside diameter, 0.032 inch wall thickness, and is approximately 0.16 cm² or about 1% of the design support area, in one embodiment. Thus the addition of two or three gas lines, for example, will have negligible effect on the thermal design.

This approach to thermal design of an ion source has additional advantages over existing design approaches. For example, for a multispecies mode of operation (e.g., $BF_3$, $PH_3$, $AsH_3$, $B_{18}H_{22}$, etc.), the ion source temperature is constant, independent of the beam current (function of discharge power) and therefore there are no thermal settling and/or drift problems when changing beam current or gases. Furthermore, warm-up times for cold starts may be reduced substantially as the source heater can be turned on as soon as the source is replaced in the system, even while the implanter is at atmospheric pressure.

The ion source temperature, which can now be well controlled, can be utilized to create a hot multi-cusp discharge ion source. This general class of ion sources utilizes permanent magnets oriented with alternative polarities on the walls of the ion source 202 to create a magnetic field which can provide a degree of plasma confinement. This can reduce the power necessary to provide a desired plasma density and also allows operation at a lower pressure, reducing the gas flow requirements. Also a permanent magnet on a hot ion source without good temperature control is generally avoided as irreversible loss of magnetism may occur if the temperature becomes too high. With good temperature control according to the present invention, samarium cobalt magnets, which are available with maximum operating temperature as high as 550° C., can be used to make the high temperature source.

Figure 3:
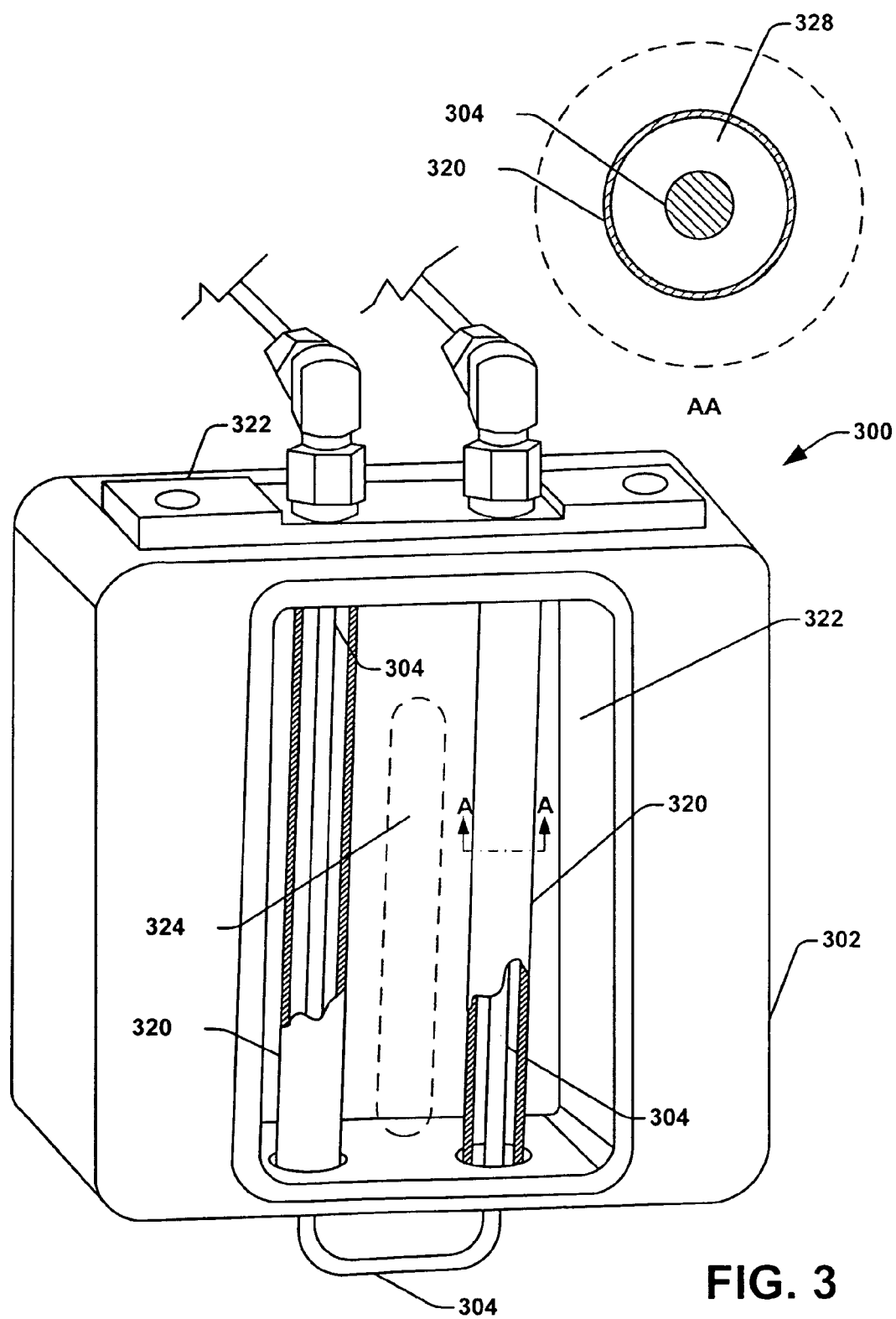
FIG. 3 is a perspective view of an ion source body of an ion implantation system in accordance with another exemplary aspect of the present invention.

FIG. 3 illustrates a perspective view of an exemplary ion source body 302 employed within an elevated temperature RF ion source system 300 with an extraction aperture removed. The exemplary ion source body assembly, for example, comprises the ion source body 302 wherein the RF antenna 304 resides, wherein sapphire tubes 320 enclose the RF antenna 304 within a plasma chamber 322 and provide a circumferential gap 328 between the outside of the antenna 304 and the inside of the sapphire tube 320 in one embodiment. It is to be appreciated that the ion source body 302 can utilize other materials than synthetic sapphire for the tube 320, for example, quartz ($SiO_2$), boron nitride, or other refractory dielectrics.

The antenna 304 can be precisely located by employing antenna support plates 322 at the top and bottom of the ion source body 302. The plates 322 can be located precisely by utilizing, for example, alignment pins (not shown). The plates 322, for example, can be manufactured from machinable ceramics, aluminum with ceramic inserts, and the like. The sapphire tubes 320 can have the ends ground precisely and fit up into precision holes in the ion source body 302 or precision inserts (not shown). In one embodiment the configuration, e.g., of the 3.18 mm (⅛ inch) O.D., copper tube, antenna 304 and the 8 mm ID sapphire tubes 320 provides a vacuum gap for thermal isolation of 2.41 mm. In addition, the sapphire tubes 320 may not need to provide a hermetic seal, but rather, may be designed to limit the gas flow out of the source 302.

In accordance with the present invention, the elevated temperature RF ion source system 300 can be maintained at any desired temperature between approximately 100° C. and 300° C. for a discharge power of less than approximately 100 W, for example for $B_{18}H_{22}$ and multi-species low current operation, and at approximately 300° C. for multi-species high current operation with RF power up to 500 W.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

The invention claimed is:

1. An elevated temperature RF ion source system, comprising:
   an ion source body;
   wherein the ion source body comprises a hollow body forming a plasma enclosure;
   an RF antenna coil configured external to the ion source body;
   wherein the RF antenna coil is wrapped around but not in contact with the hollow body;
   a vacuum enclosure surrounding both the outside surface of the ion source body and the RF antenna coil;
   at least one power supply;
   a gas delivery system operatively coupled to the ion source body;
   the RF antenna coil operatively coupled to the at least one power supply; and
   a fluid cooling system operatively coupled to the RF antenna coil, wherein the fluid cooling system comprises a fluid cooled flange in thermal communication with the RF antenna coil.

2. The elevated temperature RF ion source system of claim 1, the hollow body comprises at least one of the following shapes: conical, spherical, rectangular, octagonal and cylindrical.

3. The elevated temperature RF ion source system of claim 1, the RF antenna coil during operation is at a temperature 100 degrees Celsius or less.

4. The elevated temperature RF ion source system of claim 1, the ion source body during operation is at a temperature of 300 degrees Celsius or greater.

5. The elevated temperature RF ion source system of claim 1, the ion source body comprises in part at least one of the following materials: Alumina, Quartz, Boron Nitride and other refractory dielectrics.

6. The elevated temperature RF ion source system of claim 1, the RF antenna coil comprises at least one of the following materials: copper, aluminum and other highly conductive metals.

7. The elevated temperature RF ion source system of claim 1, the gas employed by the gas delivery system comprises at least one of the following: arsine, phosphine, boron trifluoride, $B_{10}H_{14}$ and $B_{18}H_{22}$.

8. The elevated temperature RF ion source system of claim 1, the vacuum enclosure vacuum level is 1 mTorr or less.

9. An elevated temperature RF ion source system, comprising:
   an ion source including an ion source body and an RF antenna partially internal to said ion source body;
   at least one power supply operatively coupled to said RF antenna;
   a heater element operatively coupled to said ion source body;
   a cooling component operatively coupled to the RF antenna coil and said source body,
   wherein the cooling component comprises a fluid cooled flange in thermal communication with the RF antenna coil;
   a gas delivery component operatively coupled to said source body; and
   a vacuum component operatively coupled to said ion source body for creating a vacuum condition therein.

10. The elevated temperture RF ion source system of claim 9, further comprising insulation tubing surrounding said RF antenna.

11. The elevated temperture RF ion source system of claim 9, further comprising at least one antenna support for maintaining said RF antenna in a substantially centered position within the insulation tubing.

12. The elevated temperature RF ion source system of claim 9, wherein the ion source body comprises at least one of the following materials: aluminum, stainless steel, molybdenum, tantalum and tungsten.

13. The elevated temperature RF ion source system of claim 9, wherein the ion source body is conductively coupled to the source flange.

14. The elevated temperature RF ion source system of claim 9, wherein the RF antenna comprises at least one of the following materials: copper, aluminum and other highly conductive metals.

15. The elevated temperature RF ion source system of claim 10, wherein the tubing comprises at least one of the following materials: synthetic sapphire, sapphire, quartz, alumina, Boron Nitride and glass.

16. The elevated temperature RF ion source system of claim 9, wherein during operation, the RF antenna is vacuum isolated from the insulator tubing.

17. The elevated temperature RF ion source system of claim 9, wherein during $B_{18}H_{22}$ operation, the ion source body is at a temperature approximately between 130 degrees Celsius and 160 degrees Celsius.

18. The elevated temperature RF ion source system of claim 9, wherein during multi-species operation, the ion source body is at a temperature approximately between 290 degrees Celsius and 500 degrees Celsius.

19. The elevated temperature RF ion source system of claim 11, wherein the at least one antenna support comprises at least one of the following: alumina, glass, quartz and other refractory dielectrics.

20. The elevated temperature RF ion source system of claim 9, wherein the cooling component is thermally coupled to the RF antenna coil via one or more thermally conducting support rods connecting the fluid cooled flange and the ion source body.

21. The elevated temperature RF ion source system of claim 20, wherein the fluid comprises water.

22. The elevated temperature RF ion source system of claim 1, wherein the fluid comprises water.

\* \* \* \* \*